(12) United States Patent
Knopik

(10) Patent No.: US 9,312,822 B2
(45) Date of Patent: Apr. 12, 2016

(54) POWER AMPLIFIER CIRCUIT BASED ON A CASCODE STRUCTURE

(75) Inventor: Vincent Knopik, St. Pierre d'Allevard (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 151 days.

(21) Appl. No.: 14/113,295

(22) PCT Filed: May 1, 2012

(86) PCT No.: PCT/EP2012/001870
§ 371 (c)(1),
(2), (4) Date: Jun. 20, 2014

(87) PCT Pub. No.: WO2012/150026
PCT Pub. Date: Nov. 8, 2012

(65) Prior Publication Data
US 2014/0300421 A1  Oct. 9, 2014

Related U.S. Application Data

(60) Provisional application No. 61/488,466, filed on May 20, 2011.

(30) Foreign Application Priority Data

May 2, 2011  (EP) ..................................... 11368017

(51) Int. Cl.
*H03F 1/22* (2006.01)
*H03F 3/193* (2006.01)
(Continued)

(52) U.S. Cl.
CPC ............ *H03F 3/193* (2013.01); *H01L 27/0251* (2013.01); *H03F 1/0261* (2013.01);
(Continued)

(58) Field of Classification Search
CPC ..... H03F 1/223; H03F 3/245; H03F 3/45179; H03F 1/523; H03F 2200/18; H03F 3/45188; H03F 2203/45302; H03F 2203/45311; H03F 3/19; H03F 3/195; H03F 3/45071; H03F 1/301; H03F 2200/462; H03F 2200/46; H03F 3/193; H03F 2200/451; H03F 2200/471; H03F 2200/447; H03F 1/0211; H03F 3/72; H03F 1/0205
USPC .......................................... 330/285, 296, 311
See application file for complete search history.

(56) References Cited

U.S. PATENT DOCUMENTS 8,008,974 B2 * 8/2011 Ha et al. .......................... 330/285
8,344,806 B1 * 1/2013 Franck et al. .................. 330/285
(Continued)

FOREIGN PATENT DOCUMENTS

DE  10 2004 056 435 A1  6/2006

OTHER PUBLICATIONS

International Preliminary Report on Patentability issued in corresponding International application No. PCT/EP2012/001870 on Nov. 5, 2013.

(Continued)

*Primary Examiner* — Khanh V Nguyen
(74) *Attorney, Agent, or Firm* — Patent Portfolio Builders PLLC

(57) ABSTRACT

A Power amplifier circuit based on a cascode structure and to be powered by a power source voltage, e.g. a battery, said circuit comprising -a first transistor having a grid, source and drain terminal; said first transistor being connected in a common source mode; -a second grid source transistor having grid, source and drain terminal, said second transistor being connected in common grid mode; -a biasing circuit for biasing said first transistor and said second transistor. The PA is characterized in that it includes a circuit for sensing the value of the power source voltage and for generating at least a first and a second biasing voltage for the grid of said second transistor in accordance with the power source voltage sensed, said first biasing voltage providing substantially equal protection to said first and second transistors when said power source voltage is sensed to be at a high voltage and said second biasing voltage providing more voltage to said first transistor when said power source voltage is sensed to be at a low voltage.

8 Claims, 5 Drawing Sheets

(51) Int. Cl.
- *H01L 27/02* (2006.01)
- *H03F 1/02* (2006.01)
- *H03F 1/32* (2006.01)
- *H03F 1/52* (2006.01)
- *H03F 3/19* (2006.01)
- *H03F 3/24* (2006.01)

(52) U.S. Cl.
CPC ............. *H03F 1/223* (2013.01); *H03F 1/3205* (2013.01); *H03F 1/52* (2013.01); *H03F 1/523* (2013.01); *H03F 3/19* (2013.01); *H03F 3/245* (2013.01); *H03F 2200/18* (2013.01); *H03F 2200/27* (2013.01); *H03F 2200/451* (2013.01); *H03F 2200/471* (2013.01)

(56) References Cited

U.S. PATENT DOCUMENTS

| | | | | |
|---|---|---|---|---|
| 8,624,678 | B2 * | 1/2014 | Scott et al. | 330/311 |
| 8,749,309 | B2 * | 6/2014 | Ho et al. | 330/285 |
| 2001/0036816 | A1 | 11/2001 | Wieck | |
| 2010/0156539 | A1 * | 6/2010 | Ha et al. | 330/285 |

OTHER PUBLICATIONS

Li, Mingyuan, et al., "A Single-Chip 2.4 GHz Double Cascode Power Amplifier with Switched Programmable Feedback Biasing under Multiple Supply Voltage in 65nm CMOS for WLAN Application," Radio Frequency Integrated Circuits Symposium (RFIC), 2010, IEEE, Piscataway, NJ, USA, May 23, 2010, pp. 391-394, XP031684144, ISBN: 978-1-4244-6240-7.

Sowlati, Tirdad, et al., "A 2.4-GHz 018-μm CMOS Self-Biased Cascode Power Amplifier," IEEE Journal of Solid-State Circuits, vol. 38, No. 8, Aug. 1, 2003, pp. 1318-1324, IEEE Service Center, Piscataway, NJ, USA, XP001170972, ISSN: 0018-9200, DOI: 10.1109/JSSC.2003.814417.

International Search Report and Written Opinion issued in corresponding International application No. PCT/EP2012/001870, date of mailing Jul. 6, 2012.

* cited by examiner

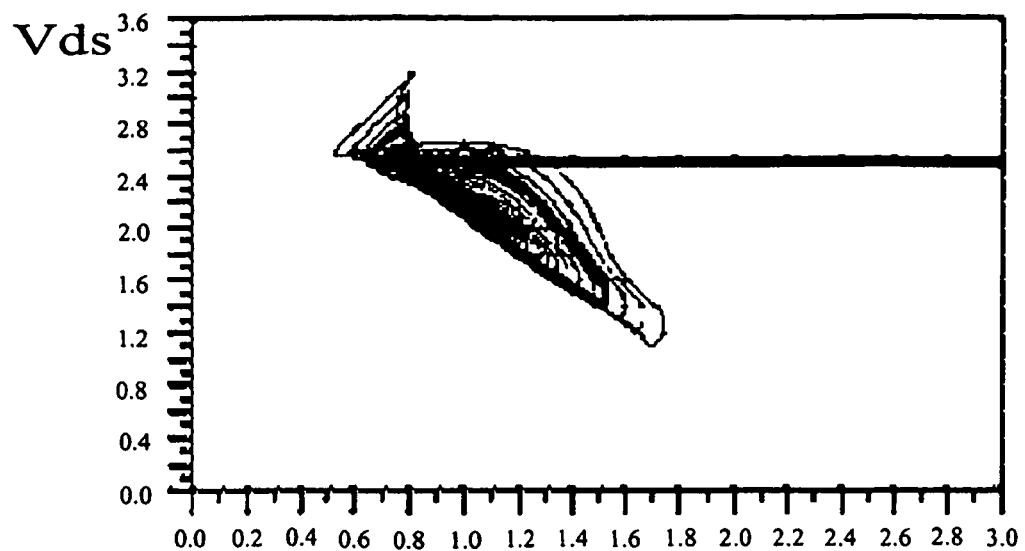
Fig. 5a  Transistor M2
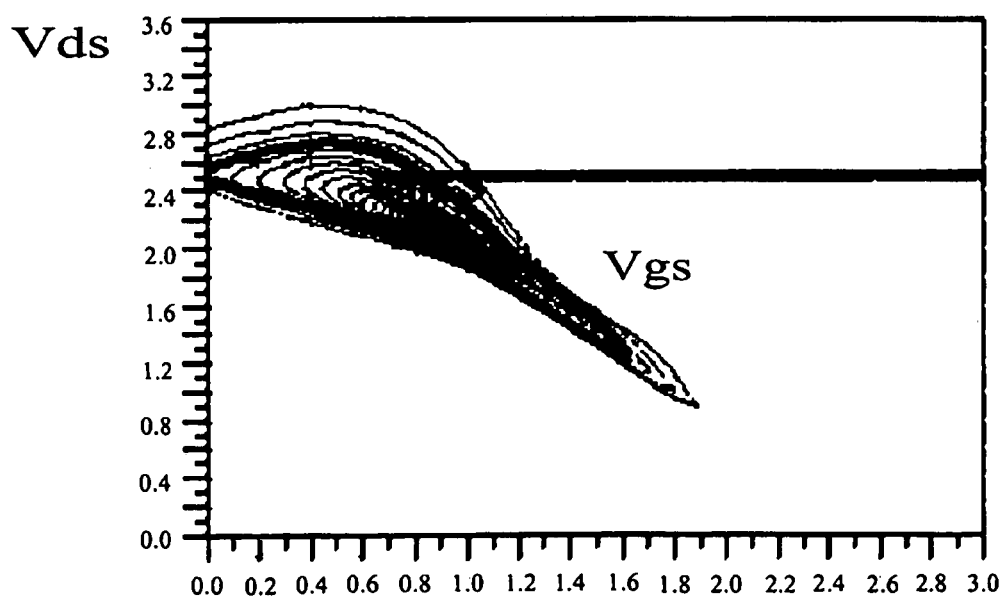
Fig. 5b  Transistor M1

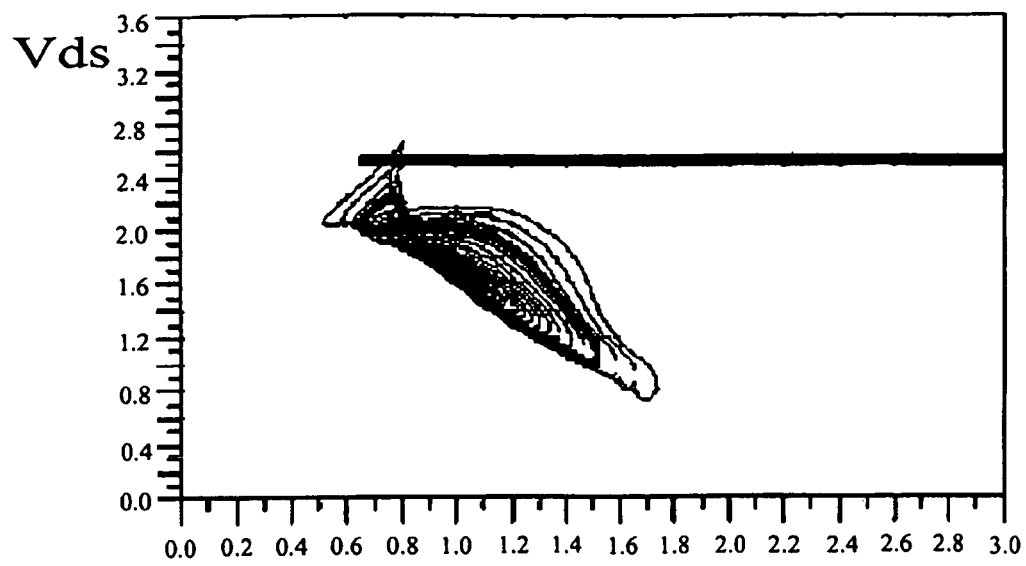
Fig. 6a  Transistor M2
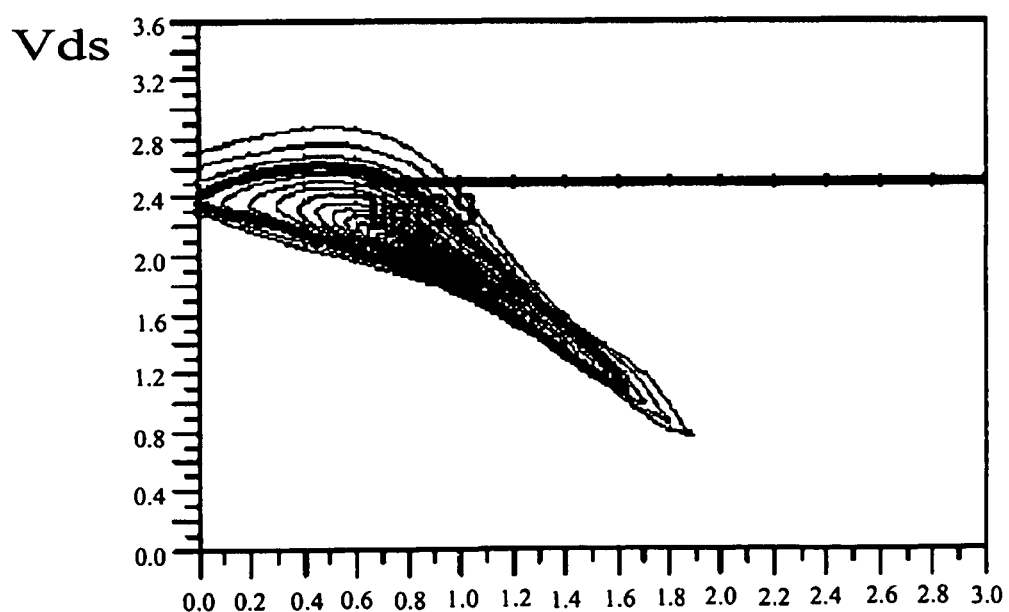
Fig. 6b  Transistor M1

POWER AMPLIFIER CIRCUIT BASED ON A CASCODE STRUCTURE

TECHNICAL FIELD

The invention relates to the field of electronic circuits and more particularly to a Power Amplifier for Radio Frequencies applications.

BACKGROUND ART

Wireless telecommunications and Radio Frequencies (RF) standards call for linear Power Amplifiers (PA) allowing reduced power consumptions. Indeed, new modulated signals with high PAPR (Peak to Average Power Ratio) (6-10 dB) have a huge impact on the Power Amplifier design optimization. As known by a skilled man, such modulations ask for very good linearity and, last but not least, efficiency as well.

To ensure the best performances, circuit designers commonly choose to directly couple the output stage to the battery voltage, when such direct coupling shows to be compatible with the maximum voltage allowed by the particular sub-micron technology being considered. Indeed, generally speaking, sub-micron MOS technology only allows limited voltages and, therefore, raises a reliability issue when higher voltages are to be considered.

One known solution for handling this problem is based on the use, for embodying the RF Power Amplifier, a specific technology which can sustain high voltages at their terminals. For instance, the so-called N lateral Diffused Extended MOS technology offering compatibility with higher voltages may be used for embodying RF output power amplifiers, but at the cost of additional drawbacks, including further non-linearities and higher manufacturing costs.

A conventional power amplifier is known which, at least partly, helps to cope with such problem is the well-known cascode structure which is used for its interesting isolation between the input and the output.

The cascode structure is based on the connection in series of at least two transistors, respectively a common source transistor associated to a common grid transistor), thus allowing to share the high voltage of the battery (at least when fully charged) between two individual transistors. Thanks to such arrangement, only a part (half) of the battery voltage is applied to each individual transistor, thus providing a "partial" protection of the individual cascode components when high voltages are being considered.

However, in wireless communications using battery powered circuits, the level of the battery may vary to a wide extent—typically between 2.5 Volt to 5 Volt and, therefore, the protection which is highly useful when the battery is fully charged becomes inappropriate and might even jeopardize linearity at low values.

In particular, for low voltage values, the PA circuit tends to be less linear and the cascode based PA needs to be combined with complex circuits or feedback loops to re-establish linearity and improve PAE. While the latter feedback loop shows phase issues (resulting in possible instability), the former linearization blocks are area consuming and increase total circuit complexity. Moreover it implies a coupler at the output which at the end reduces overall efficiency.

There is therefore a dilemma to be handled, deriving from the need of a good linearity and the need to allow large voltage swing.

The observations above shows that, so far, there is still a difficulty in reaching a trade off between reliability (maximum voltage sustained on transistor particularly when using a common "basic" sub-micron technology) and performances over a wide range of battery voltage (from 2.7 to 4.8V for instance).

Therefore, there is still a need for a specific RF PA structure allowing direct implementation in pure CMOS technology and which still shows good linearity even with a reduced battery voltage.

SUMMARY OF THE INVENTION

It is an object of the present invention to provide a Power Amplifier PA, which can be used for RF circuits, which show linear performance as well as reduced power consumption.

It is a further object of the present invention to provide a reliable RF Power Amplifier which offers good protection for the output transistors and, therefore, can be embodied using the same technology or manufacturing process which is used for the RF circuitry handling the small signals.

It is still another object of the present invention to provide a RF Power Amplifier which is based on the Cascode circuit, comprising a Common Source transistor combined with a Common Grid transistor, with a special biasing circuit for improving the reliability of the two transistors without degrading the linearity.

These and other objects of the invention are achieved by means of a Power amplifier circuit based on a cascode structure and to be powered by a power source, such as a battery, which includes a first and a second transistors, having both grid, source and drain terminals, and being respectively connected in common source and common grid mode. A biasing circuit provides adequate biasing voltages to the two transistors.

In addition, a sensing circuit is used for sensing the value of the power source voltage and for generating at least a first and a second biasing voltage for the grid of the second transistor mounted in common grid mode in accordance with the power source voltage being sensed. For high values of the power source voltage, the biasing voltage applied to the second transistor is determined so as to provide equal protection to both individual transistors forming the cascode structure. However, for lower values of the power source voltage, a second biasing voltage is applied so as to provide more voltage to the first transistor and have it work in a more linear region.

In one embodiment, the monitoring and biasing circuit comprises:

a first, a second and a third resistor connected in series between the ground and the power source voltage being sensed, the common terminal of said second and third resistors generating the biasing voltage (VG2) connected to the grid of the to second transistor. A third transistor has a source of being connected to ground and a drain connected to the common terminal of the first and second resistor. The grid of the third transistor receives a control signal switching from a high voltage to a low voltage when the sensed value of the power source voltage falls below a first predetermined value.

In a second embodiment, the monitoring and biasing circuit comprises a network of resistances comprising a first, a second, a third and a fourth resistor, all connected in series between the ground and the power source voltage. The common terminal of the third and fourth resistors generates the biasing voltage (VG2) applied to the grid of the second transistor. Two different transistors, individually controlled by a first and a second control signal, are used for short-circuiting two individual resistors of the network of the resistors so as to provide adequate shifting in the biasing voltage VG2 applied to the grid of the second transistor. Therefore, when the power source voltage is presumably high, the short circuit of two resistors among the four entails an equally biasing of the two transistors forming the cascode circuit so as to provide adequate protection ("protected mode") of each transistor. Conversely, when the voltage falls below a first (resp. a second) predetermined threshold, a shift in the biasing voltage (VG2) is applied so as to provide more room to the first common source transistor and keep the latter in a linear region.

In one embodiment, the biasing of the common grid transistor is performed by means of a network of switching transistor(s) that switche(s) resistor networks to appropriately bias the gate of said second transistor in accordance with the sensed battery voltage (Vbat).

In one alternate embodiment, the sensing and monitoring circuit generates a biasing voltage (VG2) for the grid of common grid transistor which is a continuous value of said sensed power source voltage, so as to better adapt the cascode structure to the particular profile of the battery discharge.

In one embodiment, the Power Amplifier is used for carrying out a RF PA for a mobile terminal adapter for wireless communications.

The invention also achieves a RF circuit comprising the Power amplifier circuit defined above.

DESCRIPTION OF THE DRAWINGS

Other features of one or more embodiments of the invention will best be understood by reference to the following detailed description when read in conjunction with the accompanying drawings.

FIGS. 5a and 5b respectively show the Vds versus Vgs diagrams of the two transistors M1 and M2 composing the cascade structure, when Vset=high (protected mode).

FIGS. 6a and 6b respectively show the Vds versus diagrams of the two transistors M1 and M2 composing the cascade structure, when Vset=Low (unprotected mode).

DESCRIPTION OF THE PREFERRED EMBODIMENT

It will now be described one particular embodiment of a cascode based Power Amplifier which offers good linearity and power performance over a wide range of voltage values and, therefore, is well adapted to the design of a RF power amplifier for a mobile equipment powered by a power source, such as a battery.

However, it should be clear that the power amplifier is not limited to such applications and may be used for embodying other power amplifiers.

To tackle with this, the proposed idea uses a classical approach of Cascode (Common Source CS transistor+Common Grid CG one). The common grid CG transistor is biased to a specific point that protects the overall system in a reliable way. There are different reliability issues. One if this is life time which is mainly linked to the maximum voltage applied between drain and source Vds of a transistor and relative to the input voltage applied between grid and source Vgs of the same transistor. The Vds versus Vgs should not be above a specific value given for each technology. This even more critical if the design does not use high voltage device for a low-cost purpose. This biasing point should be carefully chosen regarding the maximum voltage.

However, if the biased system is well suited for high voltage and does not degrade linearity performances, this is not the case with lower voltage anymore. Indeed, if Vgate of the CG transistor is kept to the same level as before, when Vbat decreases, VDrain of the CG decreases, making CG transistor saturating earlier, reaching non linear region faster than before. The common source transistor is always protected by the CG one but seems to be overprotected regarding real value of its VDS. The recommended approach consists in a biasing system which tunes Vgate of CS when Vbat decreases. Doing this, the CS transistor is kept into a linear region improving the linearity of the total structure in case of lower voltage.

Figure 1:
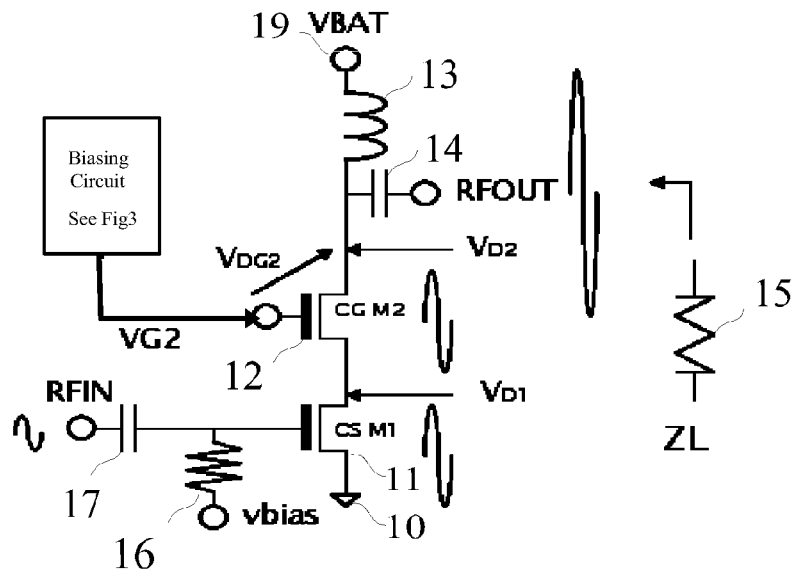
FIG. 1 illustrates one embodiment of a cascode circuit based on common sub-micro CMOS technology which can be used for implementing a RF Power Amplifier.

FIG. 1 shows one embodiment of a RF power amplifier in accordance with that approach. The cascode is based on a set of two transistors M1 11 and M2 12, each having source, drain and grid terminals. The source-drain junctions are connected in series and the two transistors M1 and M2 are respectively mounted as a common source (M1) and a common grid (M2).

The first transistor M1 has its source connected to a reference voltage, ie the ground 10, and its grid biased by means of an appropriate biasing network, such as for instance by illustrative resistor 16 connected to a bias voltage Vbias. The grid terminal of transistor M1 11 also receives an input RF signal RFin through a adequate capacitor 17.

The second transistor M2 12 has its source connected to the drain of transistor M1 and its grid biased to a voltage VG2. The drain of transistor M2 12 is connected to a load, ie load ZL 15 through a decoupling capacitor 14 and is also connected to the battery voltage Vbat through an inductor 13.

As illustrated in FIG. 1, each of the two transistors 11 and 12 share half of the voltage swing between the ground and the battery voltage Vbat, with the advantage of at least a first protection of each individual transistor being highly useful when the battery is fully charged but which, however, leads to a degraded performance at lower voltage, particularly with regard to the linearity.

Figure 2:
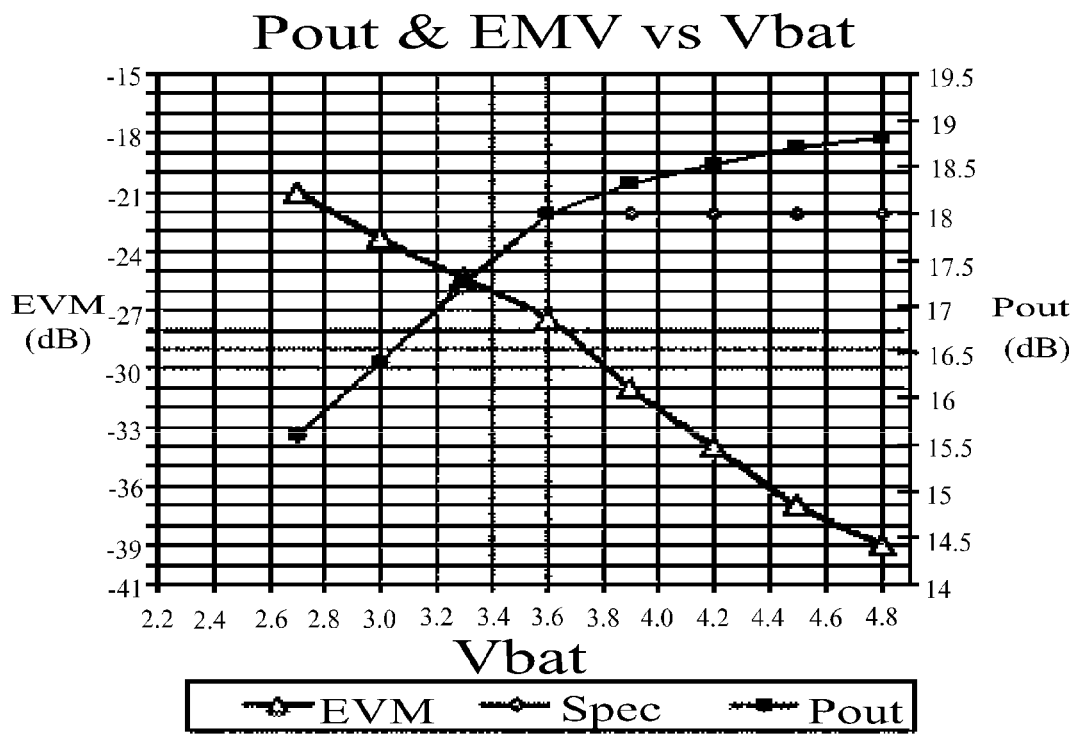
FIG. 2 shows the EVM and Pout diagrams as a function of the Battery Voltage Vbat.

FIG. 2 illustrates the performances over VBAT of a Power Amplifier (PA) designed in a cascode mode, such as the circuit of FIG. 1. The right vertical scale shows the Pout value in dB, while the left scale shows the linearity information expressed under the form of an Error-Vector Magnitude (EVM) figure representative of the linearity for a modulated OFDM signal. The lower in dB this value is, the more linear the PA. In the illustrative example of FIG. 2, it can be seen that Power amplifier PA is designed to show the best performances at a nominal voltage of 3.6V. However, the circuit needs to be protected at a value up to 4.2V (reliability). FIG. 2 shows that at high voltage the system is performing well (higher power and better linearity) while a degradation of the performance is clearly shown at lower voltage (below 3.6V) with a critical increase of the EVM value, representative of a drastic fall of the linearity of the power amplifier. The FIG. 2 also shows a typical specification for the Pout value (SPEC) which is required by RF standards.

Figure 3:
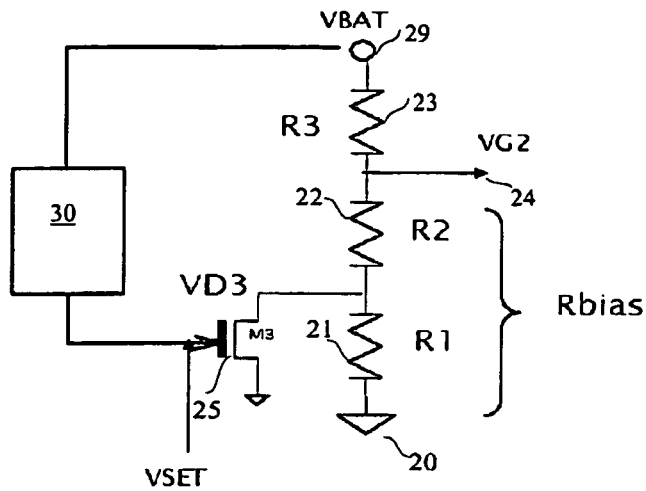
FIG. 3 illustrates a first embodiment of a biasing circuit for the cascade circuit of FIG. 1.
Figure 4:
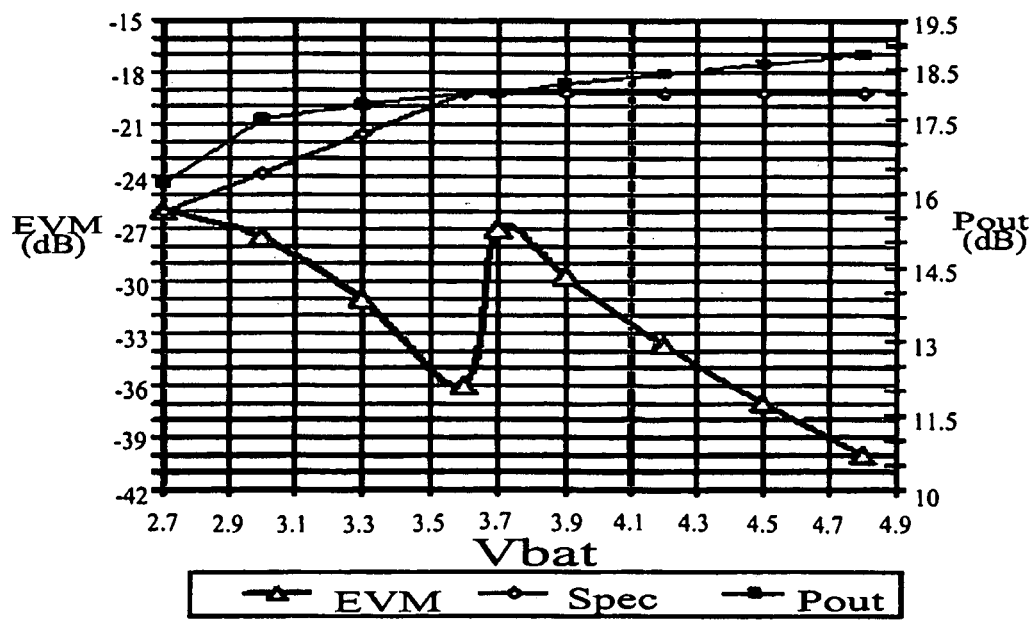
FIG. 4 shows the EVM and Pout diagrams of the circuit of FIG. 1, when using the biasing circuit of FIG. 3.

FIG. 4 shows that the linearity performance can be significantly improved for the cascode based PA, while maintaining an effective protection of the sub-micron technology used for the output transistors. One sees, indeed, that for battery voltages below 3.7 Volts, it becomes possible to significant reduce the EVM factor, "starting" again to −36 dB instead of −27 dB, thus drastically modifying the EVM picture of FIG. 3

FIG. 3 more particularly illustrates how one may achieve such improvement in the linearity by means of a first embodiment based on a specific biasing circuit which provides at least a first and a second biasing voltage VG2 dependent on the value of the battery voltage.

The biasing circuit of FIG. 3 comprises a network of resistors 21, 22 and 23 (resp. R1, R2, and R3) which are connected in series between the ground 20 and the Vbat terminal 29.

More particularly, resistor R3 23 has a first terminal connected to Vbat terminal 29 and a second terminal connected to the grid of transistor M2 12. Resistor R2 22 has a first terminal connected to the second terminal of resistor R3 and a second terminal. Resistor R1 21 has a first terminal connected to the second terminal of resistor R2 and a second terminal connected to the ground voltage reference, ie terminal 20.

In the first embodiment of FIG. 3, one sees that a first transistor M3 25 has a source, drain and grid terminal. The source is connected to the ground, while the drain is connected to the second terminal of resistor R2 22 and the first terminal of resistor R1 21.

In addition, the battery voltage is monitored by a specific sensing & monitoring circuit 30 which generates a control signal Vset applied to the grid of transistor M3 and which depends on voltage value Vbat.

In one embodiment, Vset is set to a high level (protected mode) when the battery voltage is detected to have a value superior to a first predetermined threshold. Conversely, when the value of the battery falls below that threshold, the Vset signal is set to a low level (unprotected mode).

The biasing circuit of FIG. 3 operates as follows.

When the battery shows to be fully charged, Vset is set to a high level, thus performing a short-circuit of resistor R1 21. Consequently, the network of resistors R2-R3 are adapted to generate a VG2 voltage causing each transistor M1 and M2 to share approximately half of the voltage swing between ground and the battery voltage.

With the result of a protection of the sub-micron technology transistors M1 and M2 composing the cascode structure at high value of Vbat.

When the battery tends to be discharged, the value Vbat falls and becomes lower than the above mentioned threshold voltage.

Monitoring circuit 30 detects such fall of voltage and then controls Vset signal to set it to a low level.

Consequently, voltage VG2 which is generated at the common terminal between resistor R2 and R3 is generated by the three resistors R1-R3 and is thus increased, thus modifying the biasing circuit of cascode transistors M1 and M2.

In particular, the increase of voltage VG2 causes the common source transistor M1 to be kept in a linear region even though the battery voltage decreases below to 3.6 Volts. With the consequence of a EVM factor which; as shown in FIG. 4, is significantly lower than the corresponding EVM facture of FIG. 2.

It can be seen that, at the cost of very few additional components, it is possible to achieve a cascode based Power Amplifier circuit which is significantly more flexible since it offers two distinctive mode. A first so-called "protected" mode where the two individual transistors forming the cascode structure are substantially equally biased so as to share the voltage swing and offer best protection to the individual transistors. And a second "unprotected mode" where the biasing is modified so as to improve the linearity of the cascode structure at low voltages.

While, conventionally, the total dimensioning is done at lower voltage for performances (linearity) but at the price of lower efficiency at higher voltage then, entailing the need to considered specific technologies for the output PA. Here, the system is optimized at nominal voltage (3.6V for instance), protected above (4.8V for instance) and "de"protected (because no protection is no more useful) at lower voltage (3V for instance).

It should be noticed that, while the embodiment has been described based on the biasing of transistor M2 with a current flowing into a resistor network, any other embodiment can considered. In particularly, one may use a network of switching transistor(s) that switche(s) resistor networks to appropriately bias the gate of the CG transistor. This is particularly efficient when no expensive power transistor can be used to protect the system.

FIG. 5a and FIG. 5b give a representation of the reliability in case of PA design (cascode). The main reliability issue of a cascode structure is lifetime which is related to VDS versus VGS voltage swing of each transistor. FIG. 5a shows the CG transistor 12 while FIG. 5b illustrates the CS transistor 11. A line is also drawn showing the life time threshold of each transistor for a given technology. If the VDS is high when VGS is also high a reliability lifetime reduction occurs. The design is optimized to be below and on the left of this limit. The dark shape is the maximum simulated swing for a given application. It can be seen that at 4.2V the system is quite reliable. Here Vset=1.4V, so VSET is high and the system becomes protected at high voltage.

FIGS. 6a and 6b give another representation of the reliability of the same PA but to at lower voltage (nominal and below), i.e. when VSET=0V. Even when the system is "deprotected", the structure shows to be safe. But, in that case, since the system is not "over-protected" anymore, the performances can be recovered better.

Figure 7:
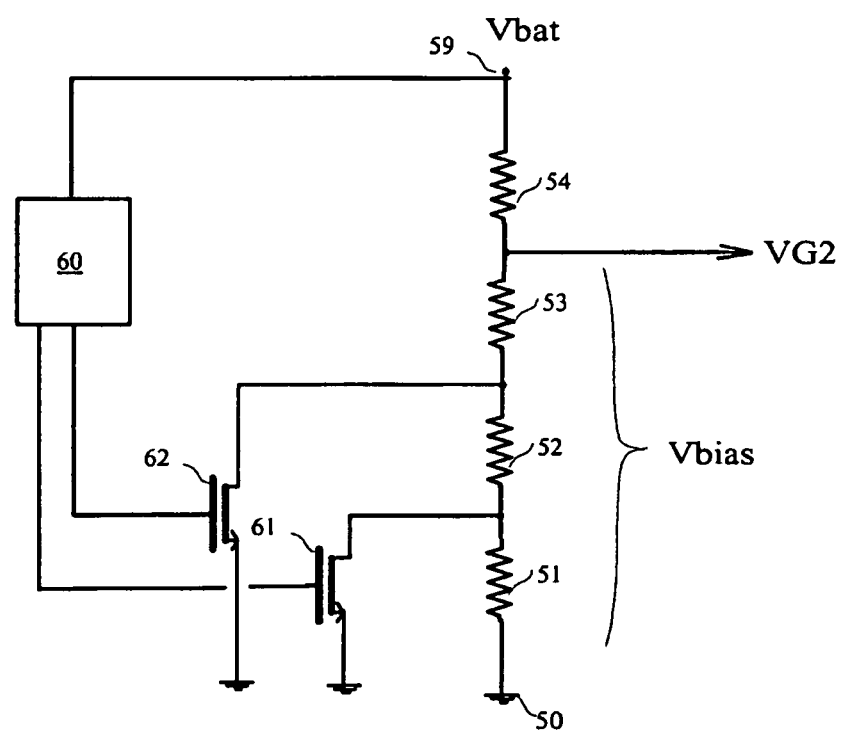
FIG. 7 illustrates an alternative second embodiment of a biasing circuit.

With respect to FIG. 7, there is illustrated a second embodiment for the circuit biasing transistor M2 12.

The circuit comprises a network of four resistors connected in series between the ground and the voltage battery.

A first resistor 51 has a first terminal connected to the ground and a second terminal. A second resistor 52 has a first terminal connected to the second terminal of the first resistor 51 and a second terminal. A third resistor 53 has a first terminal connected to the second terminal of the second resistor 52 and a second terminal. A fourth resistor 54 has a first terminal connected to the second terminal of the third. resistor 53 and a second terminal connected to the battery voltage Vbat.

A transistor 61 has grid, source and drain terminal. The source is connected to the ground and the drain is connected to the common terminal of resistors 51-52.

A transistor 62 has grid, source and drain terminal. The source is connected to the ground and the drain is connected to the common terminal of resistors 52-53.

The grid of transistors 61 and 62 are respectively connected to receive two control signals Vcontrol1 and Vcontrol2 generated by a monitoring circuit 60 sensing the battery voltage Vbat.

The circuit operates as follows:

When the battery voltage is high, monitoring circuit generates a high voltage on control signal Vcontrol2, so that the common terminal of resistors 52-53 are short-circuit to the ground.

Consequently, the second transistor M2 is biased by means of resistors 53-54 only, and the two individual transistors M1 and M2 composing the cascode structure are equally biased to share the voltage swing between the ground and the presumably high battery voltage Vbat.

When the battery voltage falls down below a first predetermined threshold, monitoring circuit 60 sets Vcontrol1 to a low level and Vcontrol2 to a high level, thus causing the VG2 voltage to be set by the three resistors 52-53-54. One sees that the biasing voltage VG2 is slightly increased so as to keep the first transistor M1 in a linear region despite the slight decrease of the battery voltage.

When the battery voltage decreases more and reaches a second lower predetermined threshold, then monitoring circuit 60 sets Vcontrol1 and Vcontrol2 to a low level, thus causing the GV2 voltage to result from the whole set of resistors 51-54 connected in series. With the consequence of an additional increase of the voltage VG2 so as to shift more the cascode transistors in an unprotected area but, still, in a linear region.

One sees again that very few components are required for achieving a very flexible circuit which provides balanced voltage protection of transistors and linearity of the whole cascode structure.

It should be noticed that, while the monitoring circuit 60 senses the battery voltage and compares the latter to two predetermined thresholds, more than two thresholds could be considered.

In one embodiment, the particular threshold values are chosen so as to correspond to the particular profile of the battery which is connected.

In another more sophisticated embodiment, sensing and monitoring circuit 60 directly generates a voltage VG2 being a continuous function F(Vbat) of the to battery voltage Vbat.

The invention allows to optimize a PA design at a nominal voltage (3.6V for instance) reaching very good performances (Pout, linearity and efficiency) while ensuring a reliability at high voltage (4.2V, 4.8V for instance) without sacrificing is performances (linearity) at lower voltage (2.7V for instance).

There is no need of any specific linearization technique to reach the performances at lower voltage and very little extra area is required. In addition, there is no variation in the input matching network and the whole circuit can be implemented in pure CMOS, in digital or analog technology.

The switch structure can be designed as a current source biasing, tuning the current flowing into the resistance network.

At last, the whole system can be implemented in a standard technology without using high performances transistor (nextD for instance) and reducing the cost as well.

The sense of power source can be put in memory to provide a known voltage distribution to the circuit. It allows to know in advance the evolution of the power source and tune the right value VG for the transistors. This is similar to a power source "predistorsion"

The number of cacode transistor is not limited to 2 and can be higher. Total voltage is shared among all the transistor. Each gate (grid) of each transistor can be tuned with the power source ragarding performances and reliability in a similar principle.

The invention claimed is:

1. Power amplifier circuit based on a cascode structure, wherein said circuit comprising at least
    a first transistor having a grid, source and drain terminal, said first transistor being connected in a common source mode;
    a second grid source transistor having grid, source and drain terminal, said second transistor being connected in a common grid mode;
    a first biasing circuit for biasing said first transistor; and
    a second biasing circuit for biasing said second transistor; and
said second biasing circuit further includes a circuit for sensing a value of the power source voltage and for generating at least a first and a second biasing voltage for the grid of said second transistor in accordance with the sensed power source voltage, said first biasing voltage providing protection to said first and second transistors when said power source voltage is sensed to be at a high voltage and said second biasing voltage providing more voltage to said first transistor when said power source voltage is sensed to be at a low voltage.

2. Power amplifier circuit according to claim 1, wherein said second biasing circuit comprises:
    a first, a second and a third resistor connected in series between the ground and the power source voltage, the common terminal of said second and third resistors generating a biasing voltage for the grid of said second transistor; and
    a third transistor having source, drain and grid terminals, the source of said third transistor being grounded, the drain of said third transistor being connected to the common terminal of said first and second resistor, the grid of said third transistor receiving a control signal switching when said power source voltage falls below a first predetermined value.

3. Power amplifier circuit according to claim 1, wherein said second biasing circuit comprises:
    a first, a second, a third and a fourth resistor connected in series between the ground and the power source voltage, the common terminal of said third and fourth resistors generating the biasing voltage for the grid of said second transistor;
    a third transistor having source, drain and grid terminal, the source of said third transistor being connected to ground, the drain of said third transistor being connected to the common terminal of said first and second resistors, the grid of said third transistor receiving a first control signal generated by a sensing circuit when said power source voltage falls below a first predetermined value; and
    a fourth transistor having source, drain and grid terminal, the source of said fourth transistor being grounded, the drain of said third transistor being connected to the common terminal of said second and third resistor, the grid of said fourth transistor receiving a second control signal generated by said sensing circuit, said voltage value Vbat falls below a second predetermined value lower than said first predetermined value.

4. Power amplifier circuit according to claim 1, wherein the biasing of said second transistor is performed by means of a network of switching transistors that switch resistor networks to appropriately bias the gate of said second transistor in accordance with the sensed power source voltage.

5. Power amplifier circuit according to claim 2, wherein said first predetermined threshold is set to approximately 3.6 Volts.

6. Power amplifier circuit according to claim 1, wherein said second biasing circuit generates a biasing voltage for the grid of said second transistor which is a continuous value of said sensed power source voltage.

7. Power amplifier circuit according to claim 1, wherein it is used for a mobile terminal adapter for wireless communications.

8. Mobile telephone including a RF circuit comprising the power amplifier circuit as defined in claim 1.

* * * * *

UNITED STATES PATENT AND TRADEMARK OFFICE
CERTIFICATE OF CORRECTION

PATENT NO. : 9,312,822 B2
APPLICATION NO. : 14/113295
DATED : April 12, 2016
INVENTOR(S) : Vincent Knopik Page 1 of 1

It is certified that error appears in the above-identified patent and that said Letters Patent is hereby corrected as shown below:

In the Specification

In Column 2, Line 51, delete "of the to" and insert -- of the --, therefor.

In Column 3, Line 45, delete "Vds versus" and insert -- Vds versus Vgs --, therefor.

In Column 5, Line 55, delete "which;" and insert -- which, --, therefor.

In Column 6, Line 32, delete "to at" and insert -- at --, therefor.

In Column 6, Line 47, delete "third." and insert -- third --, therefor.

In Column 7, Line 31, delete "to battery" and insert -- battery --, therefor.

In Column 7, Line 35, delete "sacrificing is" and insert -- sacrificing --, therefor.

In the Claims

In Column 8, Line 5, in Claim 1, delete "a value" and insert -- the value --, therefor.

In Column 8, Line 5, in Claim 1, delete "the power" and insert -- a power --, therefor.

Signed and Sealed this
Third Day of December, 2019

Andrei Iancu
*Director of the United States Patent and Trademark Office*